(12) United States Patent
Jeon

(10) Patent No.: US 6,235,577 B1
(45) Date of Patent: May 22, 2001

(54) METHOD FOR FABRICATING ELECTRODE STRUCTURE OF CAPACITOR FOR SEMICONDUCTOR MEMORY DEVICE

(75) Inventor: Yoo-Chan Jeon, Seoul (KR)

(73) Assignee: Hyundai Electronics Industrial Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/357,306

(22) Filed: Jul. 20, 1999

Related U.S. Application Data

(62) Division of application No. 08/756,366, filed on Nov. 26, 1996, now Pat. No. 5,956,224.

(30) Foreign Application Priority Data

Nov. 28, 1995 (KR) .................................................. 95-44216

(51) Int. Cl.[7] .............................................. H01L 21/8242
(52) U.S. Cl. ............................................ 438/253; 438/396
(58) Field of Search .................................... 438/253, 254, 438/396, 397, 713, 255, 398

(56) References Cited

U.S. PATENT DOCUMENTS

| | | | |
|---|---|---|---|
| 4,522,681 | * | 6/1985 | Gorowitz et al. . |
| 4,646,118 | | 2/1987 | Takemae ............................. 357/23.6 |
| 4,930,044 | | 5/1990 | Eda et al. ............................. 361/313 |
| 5,088,002 | | 2/1992 | Ogawa ................................. 361/321 |
| 5,335,138 | | 8/1994 | Sandhu ................................ 361/303 |
| 6,057,081 | * | 5/2000 | Yunogami et al. . |
| 6,066,541 | * | 5/2000 | Hsieh et al. . |
| 6,097,051 | * | 8/2000 | Torii et al. . |
| 6,117,746 | * | 9/2000 | Yoo . |

* cited by examiner

*Primary Examiner*—Tuan H. Nguyen
(74) *Attorney, Agent, or Firm*—Morgan, Lewis & Bockius LLP

(57) ABSTRACT

An electrode structure and fabrication method for a capacitor for a semiconductor memory device which have been improved suitably for the formation of a high dielectric thin film, which method includes forming an interlayer insulation film on a substrate having a transistor formed therein, forming an electrode material on the interlayer insulation layer, forming a resist on the electrode material for patterning the electrode material, forming a lower electrode each surface of which has the same slope with respect to the substrate by performing an isotropic etching on the electrode material having the resist pattern thereon and the resist, forming a dielectric film on the lower electrode to have a regular thickness, and forming an upper electrode on the dielectric film to have a regular thickness.

15 Claims, 9 Drawing Sheets

METHOD FOR FABRICATING ELECTRODE STRUCTURE OF CAPACITOR FOR SEMICONDUCTOR MEMORY DEVICE

This is a divisional of application Ser. No. 08/756,366 filed on Nov. 26, 1996 now, U.S. Pat. No. 5,956,224.

BACKGROUND OF THE INVENTION

1. Field of the Invention

The present invention relates to an electrode structure of a capacitor for a semiconductor memory device and a fabrication method thereof, and more particularly, to an improved electrode structure of a capacitor for a semiconductor memory device and a fabrication method thereof suitable for the formation of a high dielectric thin film.

2. Description of the Prior Art

Recently, as the degree of integration of semiconductor memory devices has increased, the areal size of a memory cell is decreased. Generally, the reduction in the cell size causes the area of a capacitor to be decreased. Therefore, to compensate for the reduction in capacitance, efforts continue for reducing the thickness of a dielectric film.

However, as the dielectric film is thinned, leakage current caused by tunneling is increased, resulting in lowering the reliability of the semiconductor memory device.

To prevent an extreme thinning of the dielectric film, methods for forming complicated surface irregularities to increase an effective area of a capacitor have been widely adopted, and as a result, the trend of film thinning has been slackened by using a high dielectric nitrided oxide film or re-oxidized nitrided oxide film. However, these methods result in a large level difference on the surface which make a photolithographic process difficult, and cause the production cost to be increased, which makes them difficult to be used in a high-integrated device such as a 256 MB DRAM.

Therefore, a method has been suggested that a high dielectric material is adopted as a dielectric film of a capacitor to reduce a surface irregularity of the capacitor and increase its capacitance.

$Ta_2O_5$ is widely used as a high dielectric material for a capacitor, and consequently, a film thinning, an improvement of the characteristic and a solution of the problems caused by higher integration have been effectively achieved. However, the actual dielectric constant obtained is not so high so that the range of use is not expected to be so wide when the trend of a gradually higher integration in the future is take into consideration.

So, recently, instead of $Ta_2O_5$, studies on perovskite oxides including a ferroelectric material have been conducted, and the oxides include Pb (Zr,Ti) $O_3$ (PZT), (Pb,La) (Zr,Ti) $O_3$ (PZT), (Ba,Sr) $TiO_3$ (BST), $BaTiO_3$ and $SrTiO_3$.

However, the above materials easily react with a silicon or silicide substrate, and the surface of an electrode is exposed to the atmosphere undergoes a strong oxidation in the process of formation of a thin film, resulting in a disadvantageous oxidation of the electrode.

Therefore, for the formation of a ferroelectric material using a perovskite oxide, the studies on various materials for an electrode and its structure have been continued to solve the problems resulting from an integration process.

According to the method which has been adopted for forming a capacitor, an electrode with a complicated structure is formed, and then an oxide film is formed on the surface of the electrode by a thermal oxidation, and as a result, there has been no problem for a step coverage. However, since the above-mentioned perovskite materials include many elements, and the reaction source including the elements is an organometallic compound, the formation process for a dielectric thin film is performed by a metal organic chemical vapor deposition (hereinafter, called MOCD).

However, since the MOCD has an excellent step coverage quality, it can be easily carried out on a surface having complicated irregularities or narrow holes, but in a device formed with a narrow and deep space (e.g. a fin-type or trench-type capacitor), it cannot realize an adequate step coverage. Particularly, in case the MOCD is employed in forming a dielectric film of a capacitor, as shown in FIG. 1A, when a dielectric film 3 is deposited to have a minimum thickness on an entire surface of an electrode 2, a levelled surface 3A occupying a broader area attains a thicker dielectric film, resulting in having a decreased capacitance. At the cross-sectional surface of the electrode 2, A section 3B perpendicular to the substrate 1 is perpendicularly formed to the levelled surface 3A. Consequently, the characteristic of the dielectric film 3 deposited on the orthogonal portion is lowered and an electric field is concentrated on the portion, resulting in generating a leakage current and a contamination.

To solve.the problems in the capacitor construction of FIG. 1A, a side wall 4 is formed around the electrode 2 to eliminate a sharp orthogonal portion as shown in FIG. 1B, but when the side wall 4 is composed of a conductive material, as shown in FIG. 1B, an irregularity in thickness exists on the portion perpendicular to the levelled surface 3A after the formation of the dielectric film 3, and when the side wall 4 is composed of an insulating material, the actual area of the electrode 2 is decreased.

Further, the two methods described with reference to FIGS. 1A and 1B require an additional deposition and an etching process, resulting in increasing the production cost.

Since the MOCD adopts a reaction source having a low vapor pressure, a special transferring apparatus has to be equipped for the reaction source, and the use of a plurality of reaction sources causes the process to be complicated.

The problems generated by adopting the MOCD can be easily solved by employing a sputtering method. In case of the sputtering method, since one kind of a target fabricated of a well-controlled composition is used, the composition control of the dielectric film is relatively easy, and particularly, since the sputtering method is a fully developed technology in semiconductor processing, problems which arise in the future can be easily treated.

However, since with the sputtering method a conformal deposition is impossible to obtain, it is difficult to apply to a highly integrated device.

Finally, as described above, in the conventional electrode structure of a capacitor for a semiconductor memory device, as the degree of integration of the device is rapidly increased, whatever method is adopted including the MOCD or the sputtering method, the formation process for a high dielectric thin film is difficult to perform.

SUMMARY OF THE INVENTION

Accordingly, it is an object of the present invention to provide an improved electrode structure of a capacitor for a semiconductor memory device and a fabrication method thereof in which a high dielectric thin film can be easily formed in forming a capacitor for a semiconductor memory device.

To achieve the above object, there is provided an improved electrode structure of a capacitor for a semiconductor memory device which includes a lower electrode each surface of which is formed to have the same slope with respect to a substrate, a dielectric or ferroelectric thin film formed to have a regular thickness on the lower electrode, and an upper electrode formed to have a regular thickness on the thin film.

To achieve the above object, there is also provided an improved fabrication method for a capacitor for a semiconductor memory device which includes forming an interlayer insulation film on a substrate having a transistor formed therein, forming an electrode material half as thick as the length of a shorter side among two bottom sides of a electrode of the capacitor on the interlayer insulation layer, forming a resist on the electrode material for patterning the same, forming a lower electrode each surface of which has the same slope with respect to the substrate by performing an isotropic etching on the electrode material having the resist pattern thereon and the resist, forming a dielectric film on the lower electrode to have a regular thickness, and forming an upper electrode on the dielectric film to have a regular thickness.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention will now be described in detail with reference to the accompanying drawings.

Figure 2A:
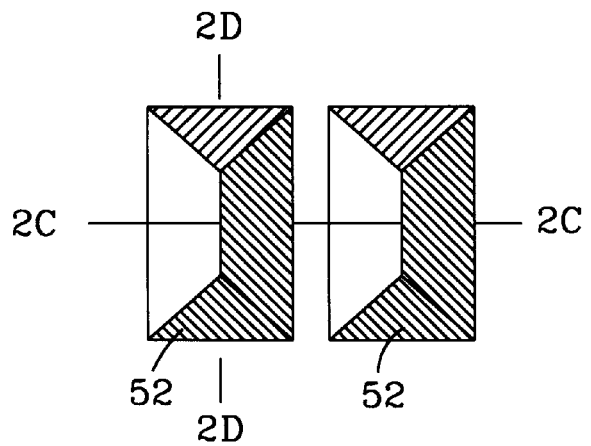
FIGS. 2A and 2B are a plan view and a perspective view showing an electrode structure of a capacitor for a semiconductor memory device according to an embodiment of the present invention.
Figure 2B:
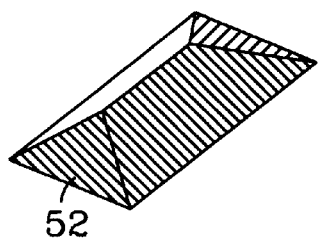
Figure 2C:
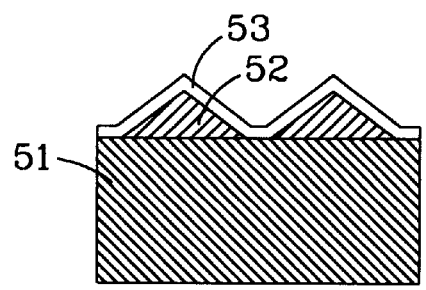
FIG. 2C is a cross-sectional view taken along the line a—a in FIG. 2A.
Figure 2D:
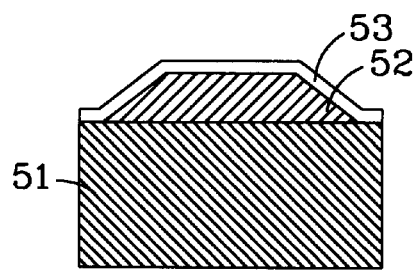
FIG. 2D is a cross-sectional view taken along the line b—b in FIG. 2A.

FIGS. 2A and 2B are a plan view and a perspective view showing an electrode structure of a capacitor for a semiconductor memory device according to an embodiment of the present invention. As shown in this drawing, each surface of an electrode 52 has the same slope with respect to a substrate. The electrode 52 includes four surfaces having the same slopes except the bottom surface, and the preferred slope each surface of the electrode 52 forms with respect to the substrate (or the bottom surface) is 45 degrees. Described in more detail, FIG. 2C is a cross-sectional view taken along the line a—a in FIG. 2A, and FIG. 2D is a cross-sectional view taken along the line b—b in FIG. 2A. Each surface of the electrode on an interlayer insulation film 51 is formed to have the same slope with respect to the substrate (not illustrated), and each electrode 52 is isolated therebetween. A dielectric thin film 53 having a predetermined thickness is formed on each isolated electrode 52 and each surface of the dielectric thin film 53 is formed to have the same slope as each surface of the electrode 52. The dielectric thin film 53 is preferably composed of a dielectric (or ferroelectric) material such as BST or PZT.

Figure 3A:
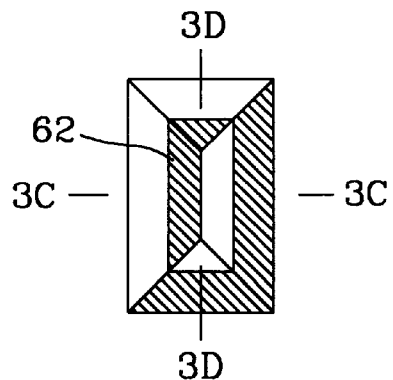
FIGS. 3A and 3B are a plan view and a perspective view showing an electrode structure of a capacitor for a semiconductor memory device according to another embodiment of the present invention.
Figure 3B:
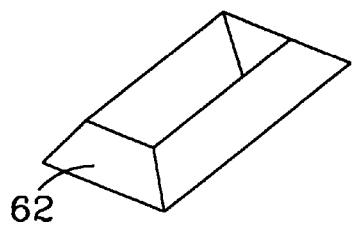
Figure 3C:
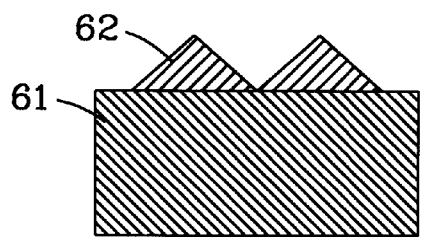
FIG. 3C is a cross-sectional view taken along the line a—a in FIG. 3A.
Figure 3D:
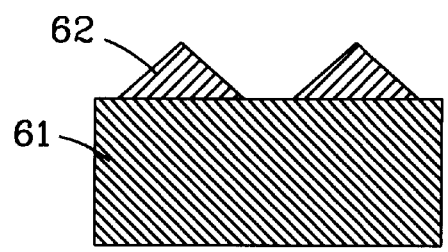
FIG. 3D is a cross-sectional view taken along the line b—b in FIG. 3A.

FIGS. 3A and 3B are a plan view and a perspective view showing an electrode structure of a capacitor for a semiconductor memory device according to another embodiment of the present invention. As shown in this drawing, the central portion of an electrode 62 is etched so that each surface of the electrode 62 has the same slope with respect to a substrate, and each electrode includes eight sides having the same slopes except for the bottom surface. The preferred angle each surface of the electrode 62 forms with respect to the substrate (or the bottom surface) is 45 degrees. Described in more detail, FIG. 3C is a cross-sectional view taken along the line a—a in FIG. 3A, and FIG. 3D is a cross-sectional view taken along the line b—b in FIG. 3A. As shown in these drawings, each surface of the electrode 62 formed on an interlayer insulation film 61 forms the same slope with respect to the substrate (not illustrated).

The electrode structure of a capacitor shown in FIGS. 2 and 3 according to the present invention has no side of the electrode perpendicular to the substrate as in the conventional electrode structure, and simultaneously, because all the surfaces of the electrode have the same slope with respect to the substrate, the problem of a dielectric film formed on the horizontal surface of the electrode having a thickness that is greater than the minimum requirements in order to obtain a minimum film thickness in the region having a low deposition rate, i.e. the perpendicular surface of the electrode, does not exist.

In the electrode structure of a capacitor according to the present invention, since each surface of the electrode forms the same slope with respect to the substrate and has no narrow space or large aspect ratio, a dielectric film having a regular thickness can be formed over an entire surface of the electrode, and a thin film having the same structure can be formed on any surface of the electrode. When a line of sight deposition such as a sputtering method is employed, the advantage of the electrode structure of a capacitor according to the present invention can be clearly seen.

Figure 1A:
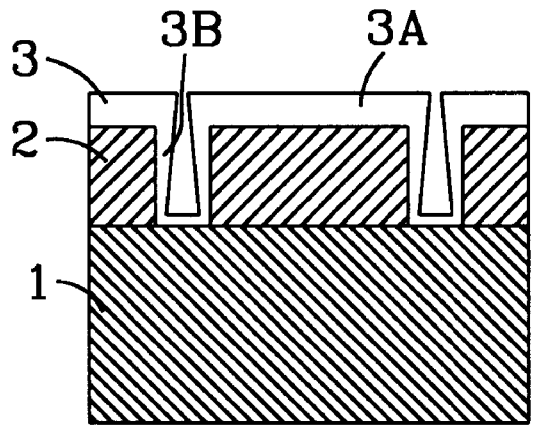
FIGS. 1A and 1B are cross-sectional views showing a dielectric film formed on an electrode of a capacitor having a perpendicular surface according to the conventional art.
Figure 1B:
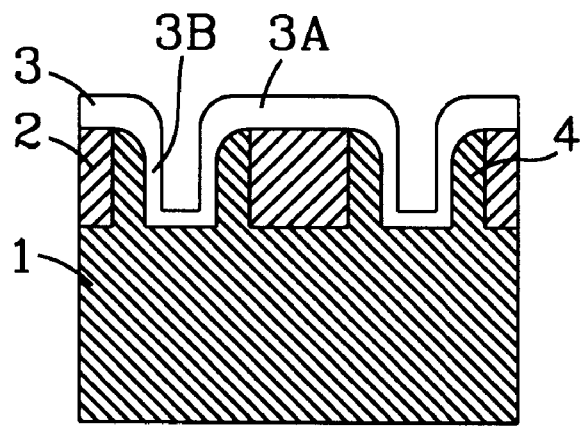

In the conventional electrode structure shown in FIGS. 1A and 1B, since a high dielectric film 3 is disposed between neighboring electrodes 2, an interference between two electrodes occurs and an electrical charge accumulated owing to the interference is dispersed and cannot produce a normal voltage. However, in the electrode structure of the capacitor according to the present invention, at the parts except the bottom portion, an interval between each electrode is distant and a plate electrode is provided therebetween to minimize an interference between electrodes.

The fabrication method for a capacitor for a semiconductor memory device according to the present invention will now be described in detail, with reference to the accompanying drawings.

Figure 4A:
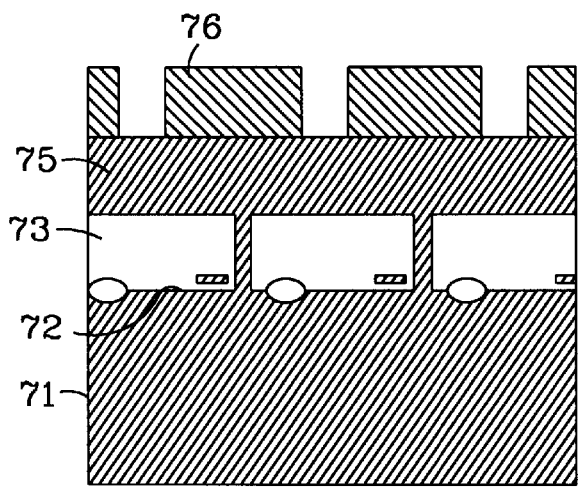
FIGS. 4A through 4F are cross-sectional views showing a fabrication method for a capacitor for a semiconductor memory device according to an embodiment of the present invention.

FIGS. 4A through 4F are cross-sectional views showing the fabrication method for a capacitor for a semiconductor memory device according to a first embodiment of the present invention. As shown in FIG. 4A, an interlayer insulation film 73 is formed on a substrate 71 having a transistor 72 formed thereon. On the interlayer insulation film 73, an electrode material 75 is deposited to have a thickness of half as long as the shorter side of the two bottom sides of an electrode to be formed later on the interlayer insulation film 73, and then a resist 76 is formed on the electrode material 75 for patterning an electrode. Here, a boundary line of the resist 76 is formed to correspond to that of a lower electrode 75b to be formed later to form an electrode on the lower portion of the resist pattern 76.

Figure 4B:
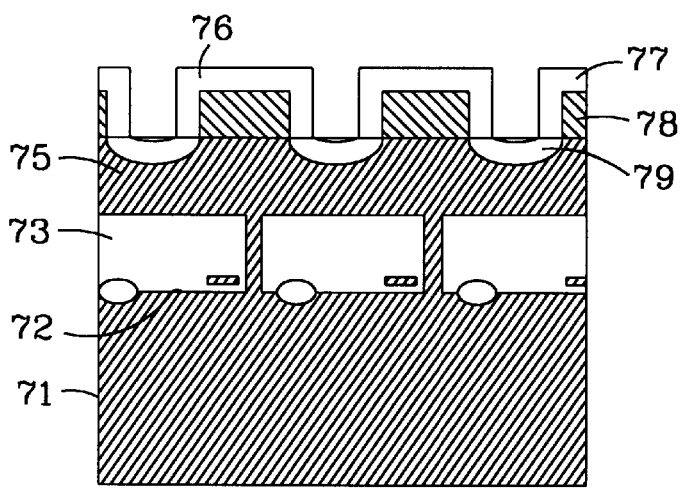
Figure 4C:
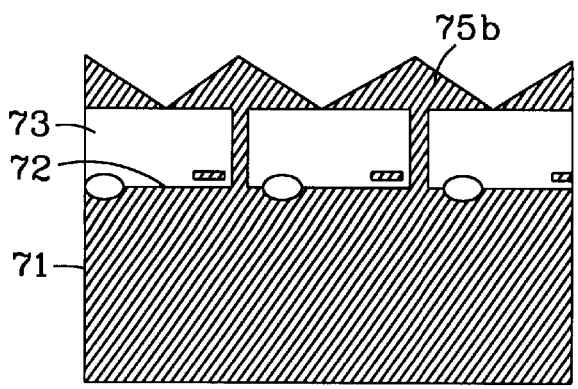

Then, the electrode material 75 having the resist pattern 76 formed thereon and the resist 76 are etched by a chemical dry etching. Here, as shown in FIG. 4B, the resist 76 is isotropically etched and simultaneously the electrode material 76 is etched to strip the resist 76. Then, as shown in FIG. 4C, the surface portion of the electrode material 75 forms the lower electrode 75b having surfaces with the same slope with respect to the substrate 71.

It is most preferred to etch the resist 76 and the electrode material 75 at the same etching rate, which may be conducted by appropriately controlling the ratio of an etchant gas for etching the electrode material 75 and an etchant gas for stripping the resist 76.

For example, when the electrode 75 composed of polycrystalline silicon is patterned by using an organic resist 76, a chemical dry etching of using a mixture of $CHF_3$ which serves as a silicon etchant gas and $O_2$ for stripping the organic resist can be employed.

That is, since an isotropic etching is performed on the organic resist 76 by $O_2$, resulting in gradually narrowing the resist pattern 76, the etching range of the electrode material 75 composed of the polycrystalline silicon and etched by the F-group generated from $CHF_3$ is gradually widened. Therefore, the boundary region starting to be etched from an initial stage is much etched in proportion to a time when it is exposed to the etchant gas, and since the central portion of the resist pattern 76 is exposed to the etchant gas for less time and is less etched, the electrode material 75 is etched to have a regular sloped surface in proportion to the time for which the material 76 is exposed to the etchant gas.

Figure 4D:
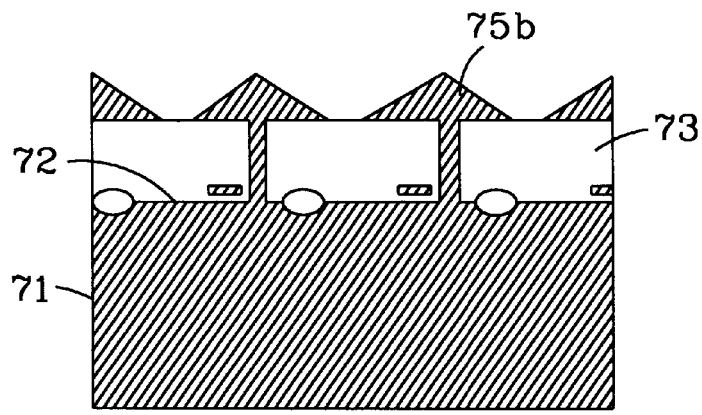

Finally, when the resist 76 is completely stripped, the electrode material 75 is completely etched to expose a predetermined portion of the surfaces of the interlayer insulation film 73 formed on the lower portion of the electrode material 75, and, as a result, as shown in FIG. 4D, each neighboring lower electrode 75b is electrically isolated.

Figure 4E:
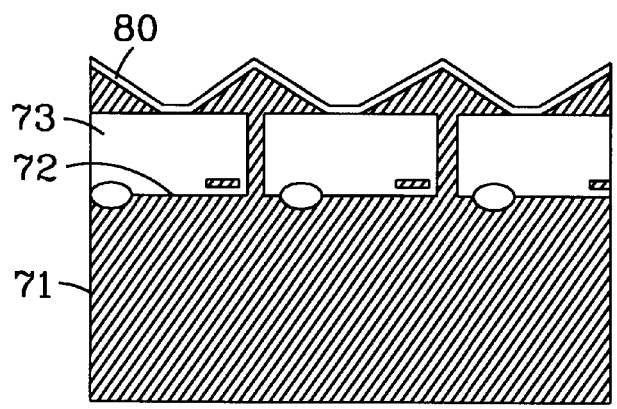

Then, after the lower electrode 75b is formed as shown in FIG. 4D, a dielectric film 80 is formed to have a regular thickness on the lower electrode 75b as shown in FIG. 4E. The dielectric film 80 may be formed by a chemical vapor deposition (CVD) or physical vapor deposition (PVD) such as a sputtering method, which is selectively used depending on the material for the dielectric film 80 and the lower electrode 75b.

Figure 4F:
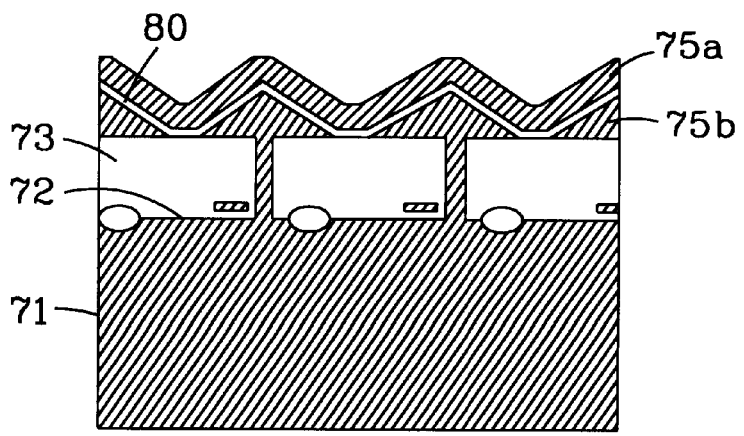

Next, as shown in FIG. 4F, an upper electrode 75a is formed by a deposition on the dielectric film 80 to have a constant thickness. The upper electrode 75a may also be formed by the CVD or PVD such as a sputtering method, which is selectively used depending on the material for the dielectric film 80 and the upper electrode 75a.

As described above, a similar etching rate of the electrode material 75 and the resist 76 enables the electrode surfaces to have an appropriate slope. Here, by controlling the etching rate of the electrode material 75 and the resist 76, the degree of the slope of the surfaces of the electrode is determined. That is, the etching rate of the electrode material 75 and the resist 76 can be changed by controlling the mixing rate of each etchant gas.

In the fabrication method for a capacitor for a semiconductor memory device according to the embodiment of the present invention shown in FIG. 4, a silicon oxide film or a silicon nitride film including the organic resist 76 can be used as the material for the resist 76 to etch the electrode material 75. Reference numeral 77 represents an etched portion of the resist, and 78 a residual portion of the resist.

FIGS. 5A through 5G are cross-sectional views showing a fabrication method for a capacitor for a semiconductor memory device according to another embodiment of the present invention.

Figure 5A:
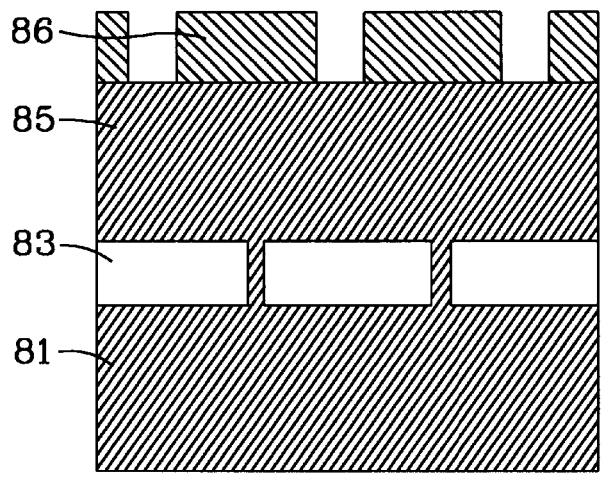
FIGS. 5A through 5G are cross-sectional views showing a fabrication method for a capacitor for a semiconductor memory device according to another embodiment of the present invention.

First, as shown in FIG. 5A, an interlayer insulation film 83 is formed on a substrate 81 having a transistor 82 formed thereon, and on the interlayer insulation film 83, an electrode material 85 is deposited to be two times as thick as a height of a lower electrode 85c to be formed later, and then, a resist pattern 86 is formed for patterning an electrode on the electrode material 85. Here, a width of the upper surface of the resist 86 is formed to correspond to that of a lower electrode 85c to be formed later below the resist pattern 86.

Figure 5B:
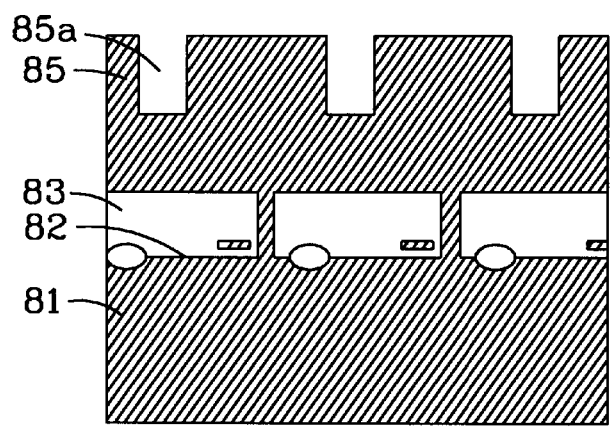

Then, as shown in FIG. 5B, a groove 85a is formed to be half as deep as the thickness of the electrode material 85 in the upper surface of the electrode material 85, and then the resist 86 is stripped. Here, the groove 85a is formed by an anisotropic etching.

Figure 5C:
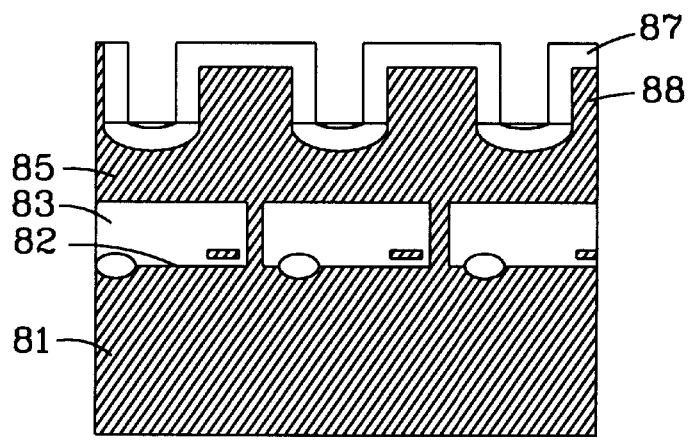
Figure 5D:
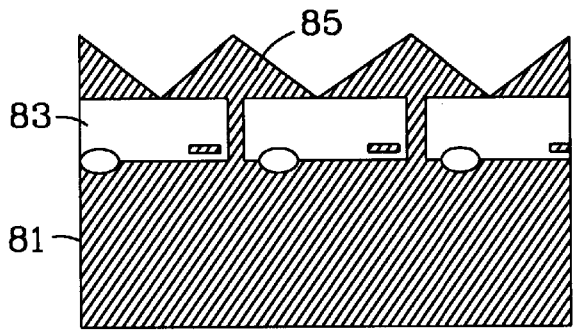
Figure 5E:
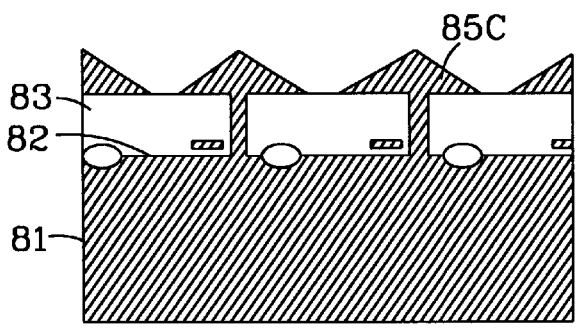

Next, as shown in FIG. 5C, the electrode material 85 having the groove 85a formed thereon is isotropically etched by a chemical dry etching. Here, when a projection 88 of the electrode material 85 is completely stripped, as shown in FIG. 5D, the electrode material 85 is formed to have the same slope with respect to the substrate 81. Then, when the etching process is continued, as shown in FIG. 5E, the electrode material around the pattern boundary portion is completely etched to expose the interlayer insulation film 83 formed on the lower portion thereof. Therefore, the lower electrode 85c of each electrode is electrically isolated from each neighboring lower portion 88.

Figure 5F:
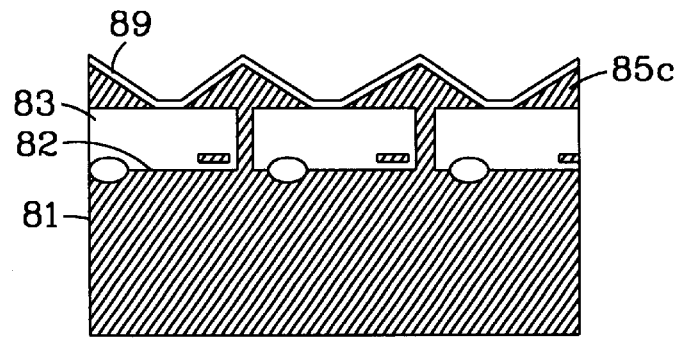

Then, as shown in FIG. 5F, a dielectric film 89 is formed to have a regular thickness on the lower electrode 85c. The dielectric film 89 may be formed by a CVD or a PVD such as a sputtering method, which is selectively used depending on the material for the dielectric film 89 and the lower electrode 85c.

Figure 5G:
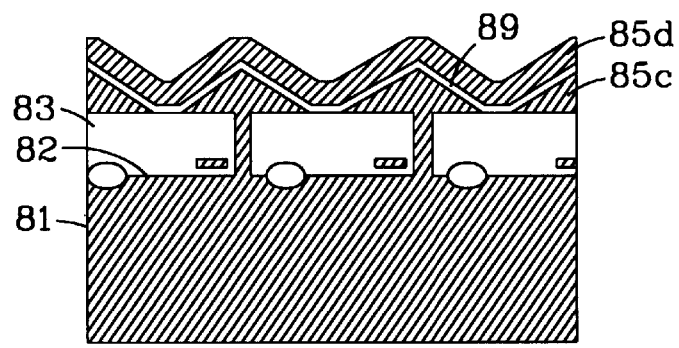

Next, as shown in FIG. 5G, an upper electrode 85d is formed by a deposition on the dielectric film 89 to have a constant thickness. The upper electrode 85d may also be formed by a CVD or PVD such as a sputtering method, which is selectively used depending on the material for the dielectric film 89 and the upper electrode 85d.

In the fabrication method for a capacitor for a semiconductor memory device according to the embodiment of the present invention shown in FIG. 5, the material for the upper and lower electrodes 85d,85c is composed of a polycrystalline silicon, a precious metal such as Pt or Au, a transition metal such as Ir or Ru, or a conductive oxide material such as $IrO_2$ or $RuO_2$.

When the upper and lower electrodes 85d,85c are composed of polycrystalline silicon, a conductive layer (not illustrated) can be formed by the CVD of a conductive material such as Pt, Au, Ir, Ru, $IrO_2$ or $RuO_2$. Here, the conductive layer is selectively formed only on the upper and lower electrodes 85d,85c composed of polycrystalline silicon, and thereby an electrode layer appropriate to a high dielectric film can be formed without employing an additional photo etching process.

In FIG. 5, reference numeral 87 represents an etched portion of the electrode material 85.

FIGS. 6A through 6G are cross-sectional views showing the fabrication method for a capacitor for a semiconductor memory device according to a third embodiment of the present invention.

Figure 6A:
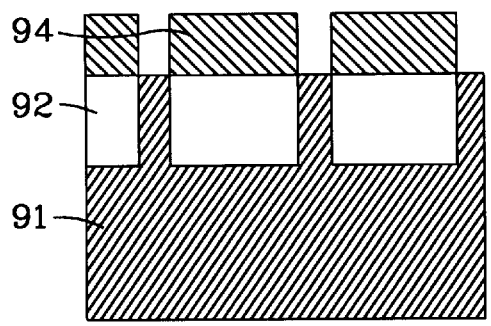
FIGS. 6A through 6G are cross-sectional views showing a fabrication method for a capacitor for a semiconductor memory device according to a third embodiment of the present invention.

First, as shown in FIG. 6A, an interlayer insulation film 92 is formed on a substrate 91 having a transistor (not illustrated) formed thereon, and a resist pattern 94 for processing the interlayer insulation film 92 is formed on the interlayer insulation film 92.

Figure 6B:
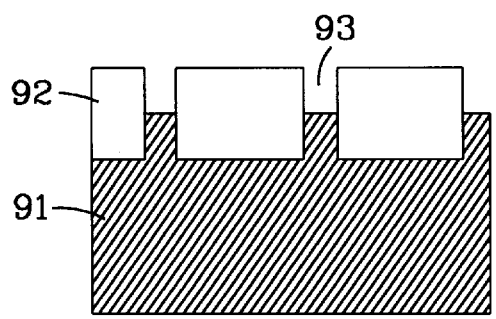

Next, as shown in FIG. 6B, a groove 93 is formed in the film 92 to be as high as a lower electrode to be formed later by an anisotropy etching such as a reactive ion etching (RIE), and the resist 94 is stripped to expose an upper surface and a predetermined portion of a side of the interlayer insulation film 92 having the groove 93 therebetween.

Figure 6C:
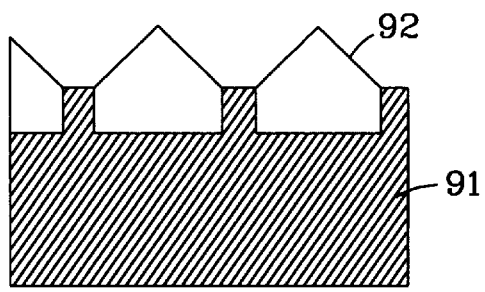

After the process of FIG. 6B is done, the exposed portion of the interlayer insulation film 92 is isotropically etched by a wet etching or a chemical dry etching. Here, each surface of the interlayer insulation film 92, as shown in FIG. 6C, is etched to have the same slope with respect to the substrate 91.

Figure 6D:
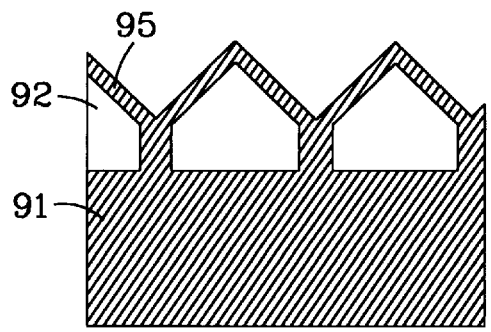
Figure 6E:
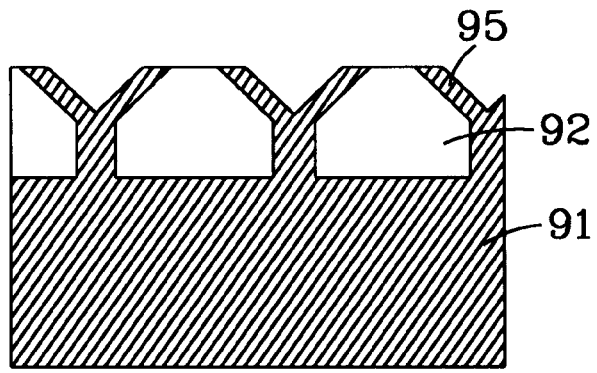

Then, as shown in FIG. 6D, a lower electrode 95 having a predetermined thickness is formed by a deposition on the etched interlayer insulation film 92, and as shown in FIG. 6E, to electrically isolate each lower electrode 95, the upper end portions of each of the interlayer insulation film 92 and the lower electrode 95 is cut off by using a chemical mechanical polishing (CMP).

Figure 6F:
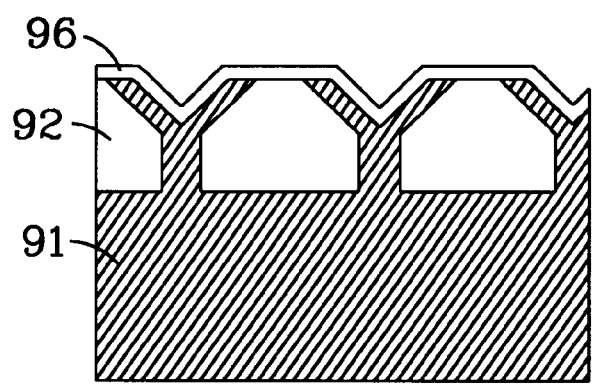
Figure 6G:
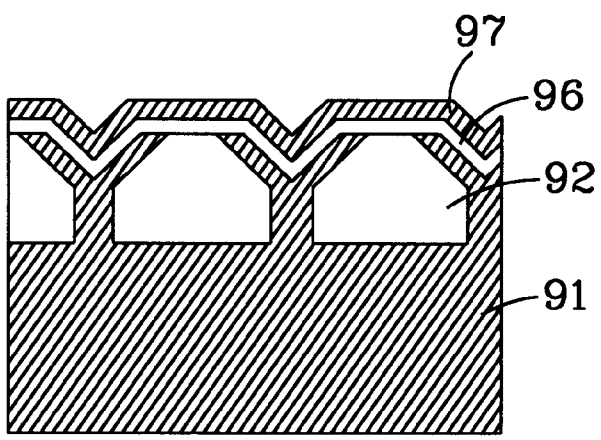

As shown in FIG. 6F, a dielectric film having a constant thickness is formed on the lower electrode 95, and as shown in FIG. 6G, an upper electrode 97 having a regular thickness is formed on the dielectric film 96.

In the fabrication method for a capacitor for a semiconductor memory device in FIG. 6, as shown in FIG. 6E, to electrically isolate each lower electrode 95, an electrode of each cell can be separated by cutting off the upper end portions of each of the interlayer insulation film 92 and the lower electrode 95 by a chemical mechanical polishing (CMP). Particularly, even if Pt or Au which is a material difficult to etch is used for the lower electrode, an electrode of each cell can be easily isolated.

As described in detail above, the effects of the electrode structure of a capacitor for a semiconductor memory device and fabrication method thereof according to the invention are as follows.

Each surface of the electrode has the same slope with respect to the substrate without having a narrow space therebetween and a large aspect ratio. Therefore, a complicated formation process is not required, and no irregular surfaces having different slopes as in the conventional art exist. Thus, when a dielectric material is deposited over the entire surface of an electrode by a CVD or PVD, a dielectric film having the same structure and thickness can be obtained over the entire surface of an electrode, which enables a dielectric film to be formed as thin as reliability permits to a maximum degree, resulting in increasing the capacitance. Further, although another electrode is formed on the dielectric material and as a result, the size and space of a capacitor are decreased, no problem due to an interference between each capacitor occurs.

In particular, since each surface of the electrode has the same slope, the deposition of a high dielectric or ferroelectric thin film can be achieved although a PVD such as a sputtering is adopted which has an excellent characteristic but little practical conventional use due to its poor step coverage. When a material difficult to form by a CVD is used as in the formation of an upper electrode, the electrode can be easily formed by using a PVD such as a sputtering, and consequently the selection range of electrode materials can be effectively broadened.

Further, when a method of processing a surface of an interlayer insulation film is employed, the formation of a lower electrode and the isolation of each electrode can be realized so easily that even precious metals on which a dry etching is difficult to perform can be effectively used as a lower electrode.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A fabrication method for a capacitor for a semiconductor memory device comprising the steps of:
   forming an interlayer insulation layer on a substrate;
   forming an electrode material layer having a bottom surface in contact with the interlayer insulation layer;
   forming a resist pattern on the electrode material layer;
   ethching the electrode material layer and the resist pattern to form a lower electrode having at least three surfaces disposed at a slope of about 45 degrees with respect to the substrate, except for the bottom surface, the at least three surfaces shaped as one of a triangle or a trapezoid;
   forming a dielectric film on the lower electrode, the dielectric film having a uniform thickness; and
   forming an upper electrode on the dielectric film, the upper electrode having a uniform thickness.

2. The method of claim 1, wherein a thickness of the electrode material layer prior to the etching step is half of a length of a shorter side of top and bottom sides of the lower electrode after the etching step.

3. The method of claim 1, wherein a length of an upper surface of the resist pattern is formed to correspond to a length of the lower electrode.

4. The method of claim 1, wherein the resist pattern and the electrode material layer are isotropically etched using chemical dry etching.

5. The method of claim 1, wherein the resist pattern and the electrode material layer are etched at the same etching rate.

6. The method of claim 1, wherein the etching of the resist pattern and the electrode material layer is carried out by controlling an etching rate in accordance with a mixing ratio of an etchant gas for etching the electrode material layer and an etchant gas for stripping the resist.

7. The method of claim 6, wherein the slopes of the at least three surfaces are determined by controlling the etching rate.

8. The method of claim 6, wherein the electrode material layer includes polycrystalline silicon.

9. The method of claim 6, wherein the resist pattern includes an organic resist.

10. The method of claim 6, wherein the etching gas for etching the electrode material layer includes $CHF_3$.

11. The method of claim 6, wherein the etchant gas for stripping the resist includes $O_2$.

12. The method of claim 1, wherein the dielectric film is formed by chemical vapor deposition.

13. The method of claim 1, wherein the dielectric film is formed by physical vapor deposition such as sputtering.

14. The method of claim 1, wherein the upper electrode is formed by chemical vapor deposition.

15. The method of claim 1, wherein the upper electrode is formed by physical vapor deposition such as sputtering.

* * * * *